US008628993B2

(12) United States Patent
Moldovan et al.

(10) Patent No.: US 8,628,993 B2
(45) Date of Patent: Jan. 14, 2014

(54) METHOD FOR USING LASER ABLATION PROCESS FOR FORMING SOLAR CELL COMPONENTS

(75) Inventors: Vasile Raul Moldovan, Stuttgart (DE); Christoph Tobias Neugebauer, Kirchheim/Teck (DE)

(73) Assignee: Manz AG, Reutlingen (DE)

( * ) Notice: Subject to any disclaimer, the term of this patent is extended or adjusted under 35 U.S.C. 154(b) by 0 days.

(21) Appl. No.: 13/512,707

(22) PCT Filed: Nov. 29, 2010

(86) PCT No.: PCT/EP2010/007221
§ 371 (c)(1),
(2), (4) Date: May 30, 2012

(87) PCT Pub. No.: WO2011/066930
PCT Pub. Date: Jun. 9, 2011

(65) Prior Publication Data
US 2012/0238049 A1 Sep. 20, 2012

(30) Foreign Application Priority Data
Dec. 1, 2009 (DE) .......................... 10 2009 056 572

(51) Int. Cl.
*H01L 21/00* (2006.01)

(52) U.S. Cl.
USPC ............... 438/57; 257/E21.328; 257/E31.11; 438/16; 438/30; 438/52

(58) Field of Classification Search
USPC ......... 438/16–17, 30, 52–57, 68, 73, 98, 455, 438/689, 680; 257/E21.328, E31.11
See application file for complete search history.

(56) References Cited

U.S. PATENT DOCUMENTS

| 2008/0182349 A1* | 7/2008 | Yamazaki et al. .............. 438/29 |
| 2009/0191663 A1 | 7/2009 | Lechner et al. |
| 2010/0062560 A1* | 3/2010 | Farris et al. .................... 438/68 |

FOREIGN PATENT DOCUMENTS

| DE | 103 26 505 A1 | 1/2005 |
| DE | 199 64 443 B4 | 8/2007 |

(Continued)

OTHER PUBLICATIONS

L Quercia, et al., "Laser Patterning of CuInSe2/Mo/SLS Structures for the Fabrication of CuInSe2 Sub Modules," Materials Science Forum, 1995, pp. 53-58, vols. 173-174, Trans Tech Publications, Switzerland.

J. Hermann, et al.; "Comparative investigation of solar cell thin film processing using nanosecond and femtosecond lasers"; Journal of Physics D: Applied Physics; Jan. 20, 2006; pp. 453-460; vol. 39; Institute of Physics Publishing; UK.

(Continued)

*Primary Examiner* — Mark A Laurenzi
(74) *Attorney, Agent, or Firm* — Hackler Daghighian & Martino

(57) ABSTRACT

Disclosed is a method for removing individual layers of a layer stack. The layer stack includes a semiconductor layer disposed onto an optically dense electrically conductive layer which in turn is disposed upon an optically transparent layer. A laser at a first power level is projected through the optically transparent layer and onto the optically dense electrically conductive layer. The semiconductor layer is removed through heat evaporation imparted by the laser at the first power level without removing the optically dense electrically conductive layer. Optionally, the laser at a second power level, which is greater than the first power level, is projected onto the optically dense electrically conductive layer through the optically transparent layer. The optically dense electrically conductive layer is removed through heat evaporation imparted by the laser at the second power level without removing the optically transparent layer.

14 Claims, 2 Drawing Sheets

(56) References Cited

FOREIGN PATENT DOCUMENTS

| | | |
|---|---|---|
| DE | 20 2008 005 970 U1 | 8/2008 |
| EP | 1 020 934 A2 | 7/2000 |
| EP | 1 727 211 A1 | 11/2006 |
| EP | 2 083 445 A1 | 7/2009 |
| EP | 2 214 213 A2 | 8/2010 |
| JP | 7 099335 A | 4/1995 |

OTHER PUBLICATIONS

A.D. Compaan, et al.; "Laser scribing of polycrystalline thin films"; Optics and Lasers in Engineering; Jul. 2000; pp. 15-45; vol. 34, Issue 1; Department of Physics and Astronomy, The University of Toledo; Toledo, Ohio.

* cited by examiner

METHOD FOR USING LASER ABLATION PROCESS FOR FORMING SOLAR CELL COMPONENTS

It is known that thin-film solar cells are composed of differing layers and thus constitute a layer stack. An electrically conductive layer is frequently applied to an optically transparent substrate, with a semiconductor layer being located on the electrically conductive layer. Another electrically conductive layer is provided as the uppermost layer.

Thin-film solar cells must be structured during the production process. This is done, for example in the case of CIS/CIGS cells, by means of a mechanical stylus or a picosecond (ps) laser. This processing step is generally carried out from above, which is to say starting from the upper electrically conductive layer. This will be described based on FIG. 1.

FIG. 1 shows a layer stack 1, comprising a glass substrate 2, on which an electrically conductive layer 3 (metallization layer), made of molybdenum for example, is disposed.

A semiconductor layer 4 is applied thereto, for example a copper indium selenium (CIS) or a copper indium gallium selenium (CIGS) layer. Another electrically conductive layer 5, for example of transparent conductive oxide (TCO) layer, is applied to the semiconductor layer 4. Reference numeral 6 denotes a mechanical stylus, which can be used for creating channels, or scribing.

So as produce several individual solar cells on a substrate which can be interconnected in series, what is known as a P2 scribing track is applied, which is to say the layer 4 is removed in some regions. The layer 5 (front-side contact) applied thereto then establishes an electrical connection to layer 3 (back-side contact). Thereafter, a P3 scribing track is introduced by removing some regions of layers 4 and 5. This step is intended to separate individual cells. No electrical connection is allowed to occur between layers 3 and 5 at this point.

The problem when using a mechanical stylus is that this stylus can introduce only relatively wide tracks and the stylus can wear down. Moreover, this method is relatively slow.

As an alternative or in addition, structuring (introducing scribing tracks) can be carried by means of a picosecond laser, as is denoted by reference numeral 7. However, picosecond lasers are very expensive to purchase.

According to the prior art, both structuring methods are carried out from above, which is to say from the side facing away from the substrate 2. Notably as a result of structuring by means of laser, the electrically conductive layer 5 may melt and flow downward at the edges of the structuring. In addition, the electrical conductivity in the semiconductor layer 4 increases significantly inside the heat affected zone due to thermal effects, whereby both effects together may cause a short circuit with the electrically conductive layer 3. This should be prevented to the extent possible.

In addition to structuring, which is to say the introduction of tracks by means of a mechanical stylus or picosecond laser, frequently what is known as edge deletion, which is to say isolation at the edge of the solar cell, is carried out. This is described, for example, in DE 199 644 43 B4.

A method for producing a photovoltaic module is known from EP 2 083 445 A1. So as to form series-interconnected cells, the transparent base electrode layer, the semiconductor layer and the back-side electrode layer are structured with separating lines using a laser, which emits infrared radiation. The semiconductor layer and the back-side electrode layer are structured starting from the substrate side by conducting laser light through the transparent front-side electrode to the semiconductor layer and back-side electrode layer.

EP 1 727 211 A1 discloses a method for structuring a thin-film solar cell. Using laser light having a first power, a semiconductor layer and a back-side electrode layer disposed thereon are removed by conducting laser light through the transparent substrate and the transparent front-side electrode disposed thereon to the semiconductor layer and back-side electrode layer to be removed. Using laser light having a second power, the layers disposed on the substrate are removed by conducting the laser light through the transparent layer to the layer stack to be removed.

DE 20 2008 005 970 U1 discloses a device for ablating layers of glass by means of laser radiation in a thin-film solar cell, in which the laser generates short pulses by Q-switching of the resonator and focal spots are generated on the layer by means of the radiation of the laser, which are stringed together by actuating devices, whereby planar ablation is achieved.

It is the object of the present invention to provide a method which can be used to remove regions of one or more layers of a layer stack in a simple and cost-effective manner. When the method is applied to solar cells, the formation of short circuits between electrically conductive layers should also be prevented by this method.

This object is achieved by a method having the characteristics of claim 1. For this purpose, the optically dense metallization layer, which advantageously exhibits higher thermal conductivity and/or a higher boiling point than the boiling point of at least one constituent of the semiconductor layer located thereabove, is preferably heated in the regions in which the semiconductor layer located thereabove is to be removed.

For example, if a track is to be introduced in the semiconductor layer, which is to say if the same is to be removed, the optically dense semiconductor layer is heated along the course of this track. By heating the optically dense metallization layer such that at least one constituent having a lower boiling point of the semiconductor layer located thereabove is evaporated, the semiconductor layer, and optionally layers located above the semiconductor layer, are removed. If the semiconductor layer is a CIS or CIGS layer, it may be sufficient to cause the selenium $$\text{(boiling point: 684.6° C., thermal conductivity } 2\tfrac{W}{mK}\text{)}$$

in the semiconductor layer to evaporate by heating the metallization layer located therebeneath. However, it is also conceivable to evaporate further constituents of the semiconductor layer. It is generally sufficient to evaporate only one constituent of the semiconductor layer, so as to cause spalling of the remaining constituents of the layer and of layers potentially located thereabove. In principle, it is also conceivable to heat the optically dense layer such that local spalling of the semiconductor layer, and optionally of layers disposed thereabove, occurs as a result of temperature differences between the optically dense layer and semiconductor layer, without any constituent of the semiconductor layer evaporating.

This type of removal of the semiconductor layer or of the layers located thereabove creates cracked edges. The risk of short circuits between a cover electrode layer (electrically conductive layer, which is disposed above the semiconductor layer; the front-side contact in a solar cell) and the optically dense metallization layer, which is a first metallization layer of a solar cell, is thus reduced.

It is particularly preferred for the optically dense metallization layer to be heated starting from the side facing away the semiconductor layer. It can thus be prevented for an electrically conductive layer (cover electrode layer) disposed on the semiconductor layer to be melted and create a short circuit with the optically dense metallization layer. The optically dense metallization layer can be designed as a molybdenum layer (boiling point: 4639° C., thermal conductivity $138\frac{w}{mK}$).

To this end, the optically dense metallization layer may be heated through one or more optically transparent layer. For example, the optically dense metallization layer can be disposed on a glass substrate and be heated through the glass substrate. In addition to an optically transparent layer, further transparent layers, and more particularly adhesion promoter layers or diffusion barriers, may be provided beneath the optically dense metallization layer. The optically dense metallization layer, which can, for example, be designed as a molybdenum layer, can also be heated through these layers.

It is particularly preferred for heating to occur by means of a laser. It is thus particularly simple to carry out heating through an optically transparent layer.

While is necessary according to the prior art to use a picosecond laser, which is very expensive to purchase, according to the invention heating is carried out by means of a nanosecond laser. Notably infrared lasers in the range of 1 μm can be used. These lasers are considerably less expensive than picosecond lasers.

Further advantages are achieved when heating is achieved by means of a pulsed laser. The application of energy can thus be metered well. In particular punctiform heating of the optically dense layer can be achieved. The expansion of the spalled second layer can thus be controlled especially well.

It is particularly preferred for the laser beam to be represented on the layer stack by means of an optical light guide having a square or round cross-section. These measures allow tracks to be introduced in the layer stack with particularly good definition.

It may further be provided that the optically dense layer is heated such that it evaporates. Before the optically dense layer evaporates, of course the semiconductor layer located thereabove will evaporate. The evaporation of the optically dense layer is particularly advantageous when edge deletion of the solar cells, and more particularly of thin-film solar cells, is to be carried.

Particular advantages are achieved when the method according to the invention is used to delete the edges of solar cells or to structure solar cells, notably thin-film solar cells.

Additional characteristics and advantages of the invention will be apparent hereafter from the detailed description of exemplary embodiments of the invention, based on figures shown in the drawings, which show details that are essential for the invention, and from the claims. The characteristics shown there shall not necessarily be considered to be true to scale and are shown such that the special features according to the invention become clearly visible. The various characteristics can be implemented in variants of the invention either individually by themselves, or several can be combined into arbitrary combinations.

In the drawings:

SUMMARY OF THE INVENTION

Figure 1:
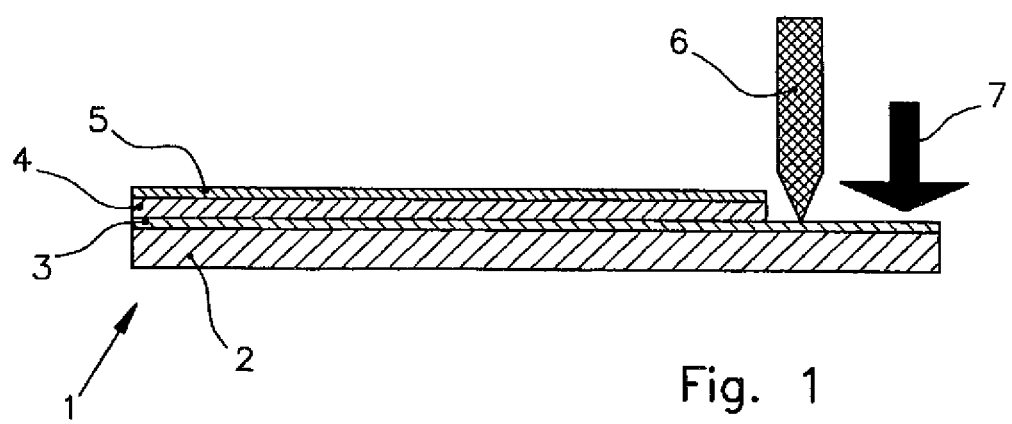
FIG. 1 shows a layer stack that was structured according to a method from the prior art.
Figure 2:
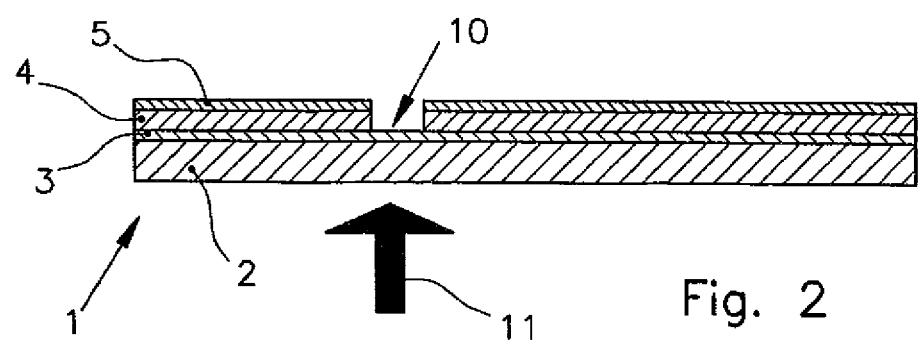
FIG. 2 shows a layer stack in which the surface of the layer stack was structured starting from the back of the layer stack.

FIG. 2 shows a layer stack 1 comprising a substrate 2, which is optically transparent. An optically dense layer 3, for example made of molybdenum, is disposed on the substrate 2. The layer 3 is an electrically conductive layer, notably a metallization layer. A semiconductor layer 4, made of CIGS for example, is disposed on the optically dense layer 3. Another electrically conductive layer 5 (cover electrode layer), which is made of TCO, for example, is applied to layer 4.

The layers 4, 5 were removed at the location 10, In particular a track was introduced here as part of what is known as P3 structuring. This structuring was carried out by local heating of the metallization layer, this being the optically dense layer 3, through the transparent substrate 2. Heating was carried out in particular such that a constituent of the semiconductor layer 4, which here is selenium, evaporated. This caused a portion of the layer stack, which is to say layers 4, 5, to spall in the region 10. A nanosecond laser was used to heat the optically dense layer 3. This is indicated by reference numeral 11.

FIG. 3 shows again the layer stack 1. It is apparent that the layers 4, 5 were removed in region 15 and additionally the optically dense layer 3 was removed in region 16. The layers 4, 5 were removed in region 15 in the same manner in which the track was introduced in region 10 of FIG. 2, which is to say the optically dense layer 3 was heated by means of a nanosecond laser 11 such that a constituent of the layer 4, for example selenium, evaporated in the layer 4 and thus layers 4, 5 spited in region 15. A well-defined torn edge 17 developed with this procedure.

So as to remove the optically dense layer 3 in the region 16, the same was heated with higher laser power, which is indicated by the wider laser 18, whereby the layer 3 melted and evaporated. Edge deletion was carried out in this manner.

Figure 3:
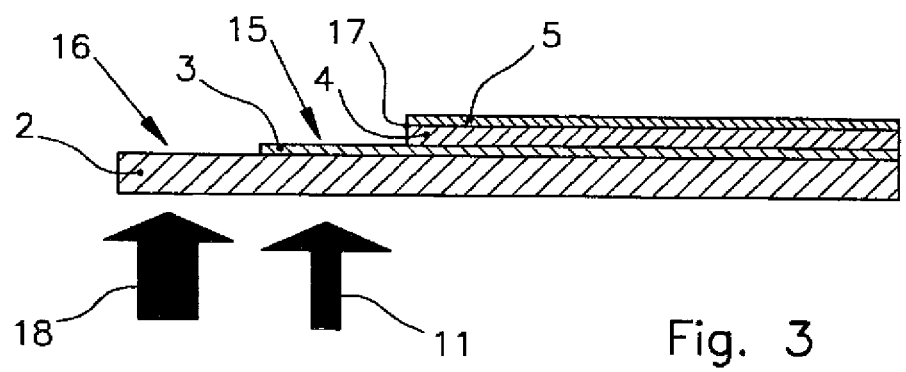
FIG. 3 shows a layer stack in which an edge deletion was carried out.

As is illustrated by FIGS. 2, 3, different layer deletion results can be achieved using the same laser, which is operated at differing powers. For example, a laser can be operated only with a low percentage of the power thereof for structuring, as is shown in FIG. 2. The laser can, for example, be operated in a slightly higher power range to expose the optically dense layer 3, as is indicated by region 15 in FIG. 3. However, if additionally also the optically dense layer 3 is to be removed, the laser can be operated at a higher percentage of the maximum power thereof. Different layer deletion can thus be achieved using only a single layer, depending on the laser power.

It is apparent from the description of FIGS. 2 and 3 that the advantages of the method according to the invention can be found in particular the production of solar cells, and more particularly in the structuring and edge deletion thereof.

We claim:

1. A method for removing at least regions of at least one semiconductor layer of a layer stack, in which an optically dense metallization layer is heated such that the semiconductor layer located thereabove is detached without removing the optically dense metallization layer, wherein the optically dense metallization layer is heated starting from the side facing away from the at least one semiconductor layer.

2. The method according to claim 1, wherein the optically dense metallization layer is heated such that at least one constituent, having lower thermal conductivity and/or a lower boiling point, of the semiconductor layer located thereabove is evaporated.

3. The method according to claim 1 wherein in that the optically dense metallization layer is heated through one or more optically transparent layers.

4. The method according to claim 1 wherein in that the heating is achieved by means of a laser.

5. The method according to claim 1 wherein in that the heating is achieved by means of an ns laser.

6. The method according to claim 1 wherein the heating is achieved by means of a pulsed laser.

7. The method according to claim 1 wherein the laser beam is represented on the layer stack by means of an optical light guide having a square or round cross-section.

8. The method according to claim 1 wherein the optically dense metallization layer is heated such that it evaporates after the at least one semiconductor layer has been removed.

9. The method according to claim 1 wherein edge deletion of a solar cell is carried out.

10. The method according to claim 1 wherein solar cell structuring is carried out.

11. A method for removing individual layers of a layer stack, comprising:
   forming the layer stack comprising a semiconductor layer disposed onto an optically dense electrically conductive layer which in turn is disposed upon an optically transparent layer;
   projecting a laser at a first power level through the optically transparent layer and onto the optically dense electrically conductive layer; and
   removing the semiconductor layer through heat evaporation imparted by the laser at the first power level without removing the optically dense electrically conductive layer.

12. The method of claim 11, including the step of projecting the laser at a second power level which is greater than the first power level onto the optically dense electrically conductive layer through the optically transparent layer.

13. The method of claim 12, including the step of removing the optically dense electrically conductive layer through heat evaporation imparted by the laser at the second power level without removing the optically transparent layer.

14. The method of claim 13, wherein the semiconductor layer comprises selenium.

* * * * *